United States Patent
Thomas et al.

(10) Patent No.: US 12,550,779 B2
(45) Date of Patent: Feb. 10, 2026

(54) HERMETICALLY SEALED GLASS PACKAGE

(71) Applicant: Schott AG, Mainz (DE)

(72) Inventors: Jens Ulrich Thomas, Mainz (DE); Thorsten Damm, Eltville am Rhein (DE); Thomas Zetterer, Landshut (DE)

(73) Assignee: Schott AG, Mainz (DE)

( * ) Notice: Subject to any disclaimer, the term of this patent is extended or adjusted under 35 U.S.C. 154(b) by 477 days.

(21) Appl. No.: 17/891,823

(22) Filed: Aug. 19, 2022

(65) Prior Publication Data

US 2022/0406672 A1 Dec. 22, 2022

Related U.S. Application Data

(63) Continuation of application No. PCT/EP2021/054179, filed on Feb. 19, 2021.

(30) Foreign Application Priority Data

Feb. 21, 2020 (DE) .................... 10 2020 104 613.8

(51) Int. Cl.
*H01L 23/29* (2006.01)
*B23K 26/20* (2014.01)
*H01L 23/15* (2006.01)

(52) U.S. Cl.
CPC .......... *H01L 23/291* (2013.01); *B23K 26/206* (2013.01); *H01L 23/15* (2013.01); *Y10T 428/131* (2015.01)

(58) Field of Classification Search
CPC ..... H01L 23/291; H01L 23/15; B23K 26/206; Y10T 428/131; B81C 1/00317;
(Continued)

(56) References Cited

U.S. PATENT DOCUMENTS 9,117,996 B2 8/2015 Kobayasghi
10,069,104 B2 9/2018 Dabich, II et al.
(Continued)

FOREIGN PATENT DOCUMENTS

DE 102 35 372 A1 2/2004
DE 10 2004 043 120 A1 3/2006
(Continued)

OTHER PUBLICATIONS

Notification of the Transmission of the International Search Report and Written Opinion of the International Search Authority or Declaration dated May 12, 2021 for International Application No. PCT/EP2021/054179 (13 pages).

*Primary Examiner* — James C Yager
(74) *Attorney, Agent, or Firm* — TAYLOR & EDELSTEIN, PC

(57) ABSTRACT

A package for encapsulating a functional area against an environment includes a base substrate and a cover substrate, the base substrate together with the cover substrate defining at least part of the package or defining the package, and furthermore including the at least one functional area provided in the package, and a blocking way for reducing permeation between the environment and the functional area. The package may include at least one laser bonding line, and the substrates of the package can be hermetically joined to one another by the at least one laser bonding line, and the laser bonding line has a height (HL) perpendicular to its bonding plane.

27 Claims, 6 Drawing Sheets

(58) Field of Classification Search
CPC .......... B81C 2203/036; B81C 1/00293; B81C 2203/031; B81B 2201/0214; B81B 2201/058
See application file for complete search history.

(56) References Cited

U.S. PATENT DOCUMENTS

| | | |
|---|---|---|
| 10,497,898 B2 | 12/2019 | Boek et al. |
| 11,264,296 B2 | 3/2022 | Huang et al. |
| 2007/0259470 A1 | 11/2007 | Quenzer et al. |
| 2008/0206925 A1 | 8/2008 | Chatterjee et al. |
| 2011/0147803 A1 | 6/2011 | Henneck et al. |
| 2013/0115460 A1 | 5/2013 | Yamada |
| 2013/0126938 A1 | 5/2013 | Eberhardt et al. |
| 2014/0087099 A1 | 3/2014 | Veerasamy et al. |
| 2014/0174507 A1 | 6/2014 | Jung et al. |
| 2014/0273351 A1 | 9/2014 | Nicolas |
| 2016/0137487 A1 | 5/2016 | Nicolas |
| 2017/0179092 A1* | 6/2017 | Sasaki .................. H01L 25/167 |
| 2020/0051883 A1 | 2/2020 | Huang et al. |

FOREIGN PATENT DOCUMENTS

| | | |
|---|---|---|
| EP | 3 012 059 B1 | 10/2017 |
| JP | 2009-135749 A | 6/2009 |
| JP | 2012-104397 A | 5/2012 |
| JP | 2014-149941 A | 8/2014 |

\* cited by examiner

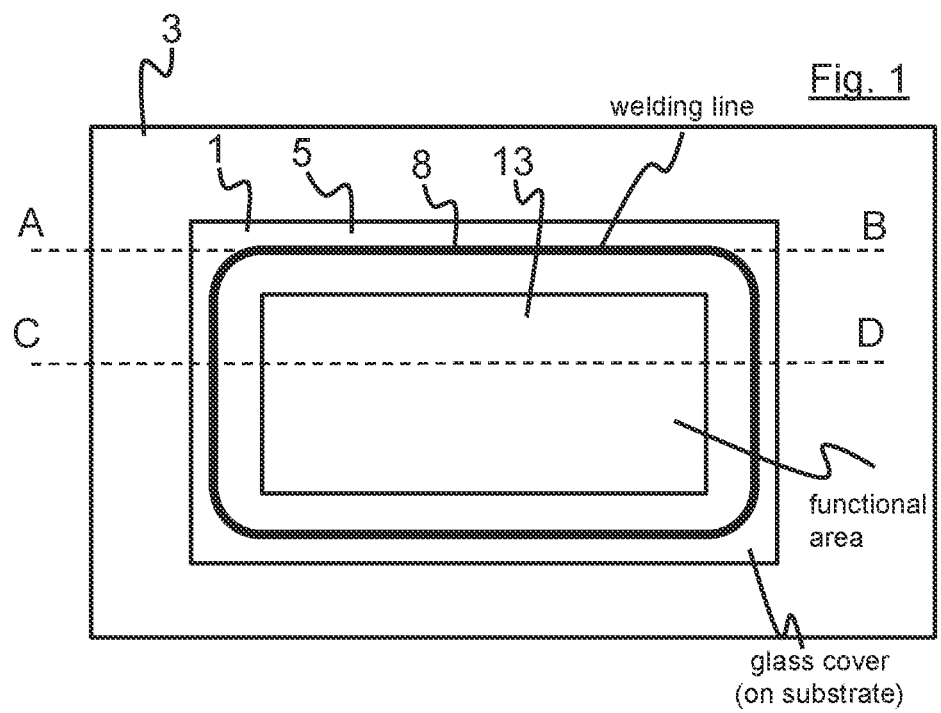
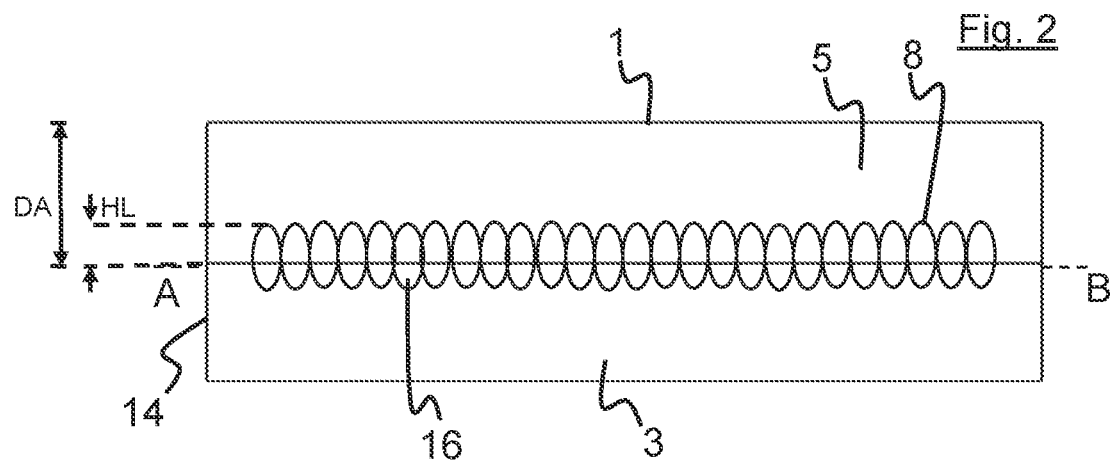
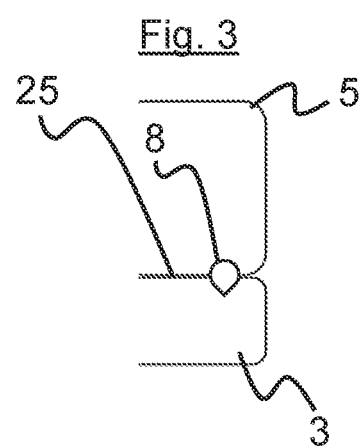

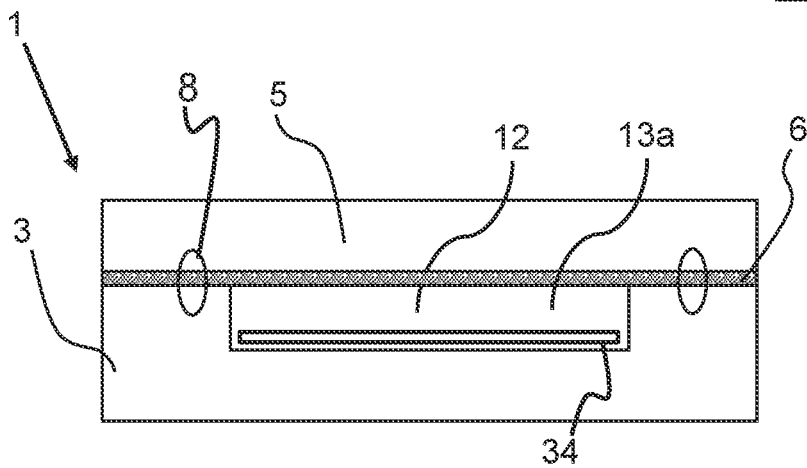
Fig. 4
Fig. 4a
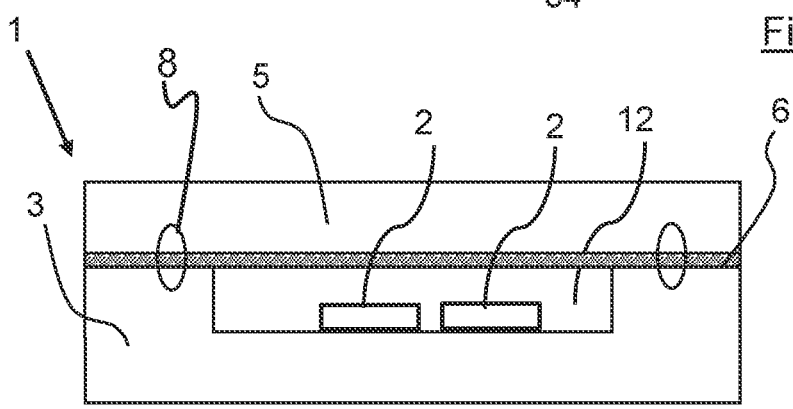
|   | Caption |
|---|---|
| 3 | Sheet with cavity, optionally with lower permeability |
| 12 | Cavity |
| 5 | Cover sheet, optionally with higher permeability |
| 6 | Barrier layer |

| | Caption |
|---|---|
| 3 | Sheet with cavity, optionally with lower permeability |
| 5 | Cover sheet |
| 6 | Barrier layer |
| 12 | Cavity |
| 13 | Functional area |
| 13a | Functional layer |

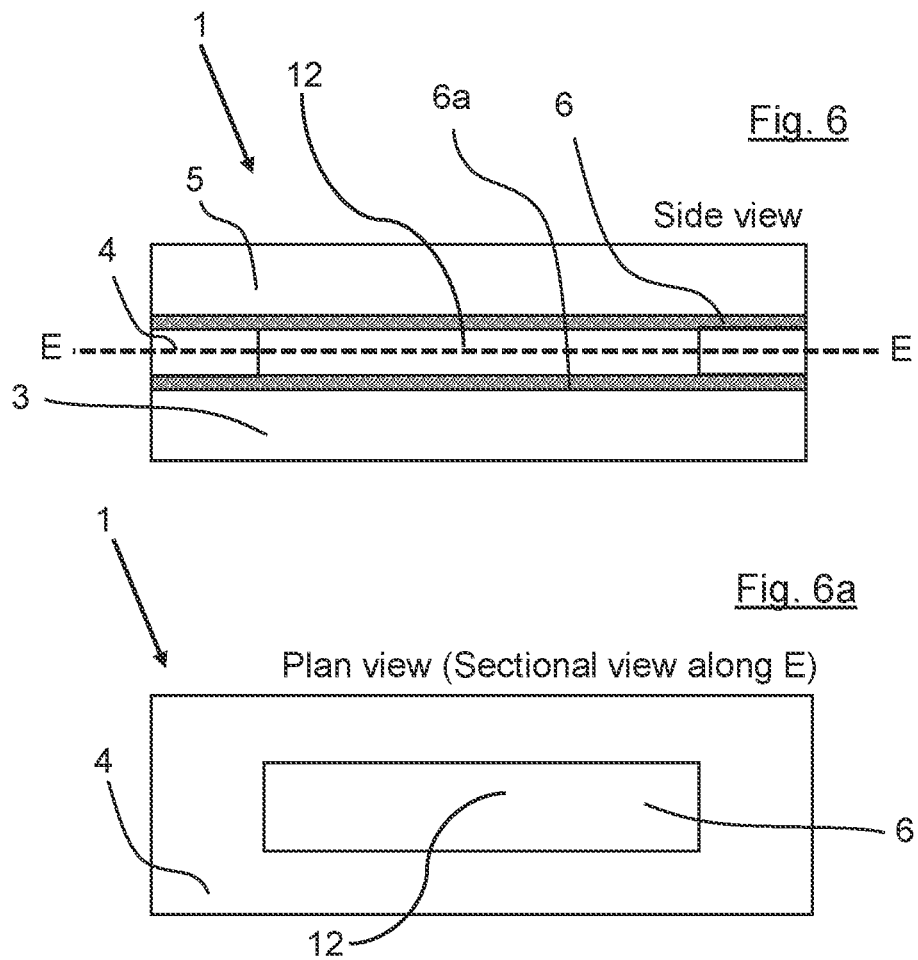

| | Caption |
|---|---|
| 3 | Sheet with cavity, with high or low permeability |
| 12 | Cavity |
| 5 | Cover sheet with high or low permeability |
| 6 | Barrier layer |

| FIG. 8A | Providing the device carrying substrate with recesses for the components to be accommodated |
| FIG. 8B | Applying a cover substrate and/or including blocking means, and sealing the cavities |
| FIG. 8C | Laser welding the accommodation cavities |
| FIG. 8D | Separating/cutting the wafer, i.e. the packages |

HERMETICALLY SEALED GLASS PACKAGE

CROSS REFERENCE TO RELATED APPLICATIONS

This is a continuation of PCT application no. PCT/EP2021/054179, entitled "HERMETICALLY SEALED GLASS ENCLOSURE", filed Feb. 19, 2021, which is incorporated herein by reference. PCT application no. PCT/EP2021/054179 claims priority to German patent application no. 10 2020 104 613.8, filed Feb. 21, 2020, which is incorporated herein by reference.

BACKGROUND OF THE INVENTION

1. Field of the Invention

The invention relates to a multi-layered glass package and to a method for providing such a glass package.

2. Description of the Related Art

Packages that can for example be hermetically sealed (and which may also be referred to as enclosures, encapsulations, or housings), can for instance be used to protect sensitive electronics, circuits, optical and optoelectronic components (e.g. OLEDs) and also sensors, for example. They allow to apply medical implants, for example in the area of the heart, in the retina, or for bio-processors. Bio-processors made from titanium have been known and are being employed. On the other hand, a medication or something else can also be packed, for example hermetically sealed, in a package. When implanted in the body, such implants can then deliver medication in precisely dosed amounts over an elongated period of time.

Fields of application that are of interest include the following: sensors that can be protected against particularly adverse environmental conditions by a package; MEMSs (micro-electromechanical systems), barometers, blood gas sensors, glucose sensors, etc.; a smartphone, virtual reality glasses, and similar devices; the production of flow batteries, for example, in the context of electro-mobility; packages for the aerospace industry, in high-temperature applications, and in the field of micro-optics.

What the aforementioned application purposes have in common is the prevalence of adverse application conditions, so that the components are subject to high requirements with regard to their robustness, as if they were exposed to such environmental influences without protection. In order to enable the use of such components that cannot be expected to withstand such external impacts, what is needed in the art is a package that can be employed to protect these components from such adverse environmental influences.

Furthermore, there may be the requirement of ensuring an exchange with the interior of the package, that is, for example, of a cavity defined by the package, for example involving electromagnetic radiation, for example in the visible range and/or in the range of microwave radiation, that means that the package should be transparent at least partially, i.e. at least in portions thereof and/or at least for some range of wavelengths. This transparency allows for communication processes, data or power transfer, measurements of and with the electronics or the sensor disposed in the cavity. For example optical communication techniques or optical data and power transfer can be facilitated.

In principle, it has been known to join a plurality of parts and to arrange these parts such that an accommodation area is created in an intermediate space, which can accommodate components. For example, European patent EP 3 012 059 B1, which is hereby incorporated by reference, discloses a method for producing a transparent piece for protecting an optical component. A novel laser process is used for this purpose.

In the context of the present further development of enclosures or packages according to the invention, the issue which has now been addressed is that the materials used to form a package exhibit non-zero permeability. Thus, gases or liquids enclosed in the cavity can escape to the outside of the package, or such substances or fluids from the environment can penetrate into the package. This can be caused by a concentration gradient, i.e. the build-up of an osmotic pressure, for example, or by pressure differences. The more impermeable a package material is, the longer the penetration time that a corresponding substance or fluid will need in order to penetrate through the material of the package.

Although the expected time constants for glass are in the order of years, this can be particularly relevant for products with a long service life, such as implants or medical packaging.

A measure for the calculation of time constants for given materials, geometries, and environmental conditions is the concentration of impurities in an initially pure gas inside a cavity after a certain time, for example. In the case of simple electronics, for example, this can be a value that must be below 5000 ppm in a hermetically sealed package. This may relate to water vapor for example. Other limits to be observed can be defined for other applications and gases or fluids.

When choosing the material for the enclosure or package, factors such as costs, strength, CTE, shapability and inertness to enclosed substances were initially of greatest importance. Since the excellent materials that have already been found by the Applicant were desired to be gradually employed for further application areas, for example for long-lasting implants, what is needed in the art is an improved package which does not impair the aforementioned important factors unless to an insignificant extent.

SUMMARY OF THE INVENTION

Sensors can be protected against particularly adverse environmental conditions by a package according to the present invention. This field also includes MEMSs (micro-electromechanical systems), barometers, blood gas sensors, glucose sensors, etc. Another field of application for a package according to the present invention can be found in a case for a smartphone, in the field of virtual reality glasses and similar devices. A package according to the present invention can also be used for the production of flow batteries, for example in the context of electro-mobility. However, packages according to the present invention can also find application in the aerospace industry, in high-temperature applications, and in the field of micro-optics.

The present invention therefore concerns the context of improving packages and for example to make them more robust. So, in other words, the present invention deals with providing an improved package, and one way of achieving this has in particular been found in improving the permeation of the package material.

A package according to the present invention for encapsulating a functional area against an environment includes a base substrate and a cover substrate, the base substrate together with the cover substrate defining at least part of the encapsulation or package. Furthermore, the package encloses at least one functional area that is provided inside the package. The functional area is for example hermetically sealed by the package.

The package according to the present invention furthermore includes a blocking way to reduce permeation between the environment and the functional area. In one example, such blocking way includes a barrier layer disposed around the functional area.

The package according to the present invention can be hermetically sealed by established as well as by novel joining methods. Optionally, the package is hermetically sealed using a laser welding process developed by SCHOTT. Alternatively, depending on the application requirements, other methods can also be used to establish the glass-to-glass bond. These include for example: anodic bonding, glass frit bonding, or fusing using a $CO_2$ laser. Below, laser welding will be discussed as a representative process for exemplary applications.

The package can furthermore have at least one laser bonding line, so that the substrates of the package are joined to one another in a hermetically sealed manner by the at least one laser bonding line. Each laser bonding line has a height HL perpendicular to its bonding plane. Optionally, the height HL of the laser bonding line extends into the material of the substrate arranged above the laser bonding line. On the opposite side, the laser bonding line extends into the material of the substrate arranged below the laser bonding line. In other words, the laser bonding line extends into the two substrates that are to be joined together or that are joined to one another by the laser bonding line.

For example, the cover substrate is joined to the base substrate by being fused thereto.

In other words, material of one substrate melts and mixes with material of the other substrate during the bonding step or in the laser bonding line to produce the firm and non-releasable hermetic bond between the one substrate and the other substrate. In another example, at least one intermediate substrate is disposed between the base substrate and the cover substrate, and in this case the base substrate is joined to the intermediate substrate in a first bonding plane by at least one first laser bonding line, and the cover substrate is joined to the intermediate substrate in a second bonding plane by at least one second laser bonding line.

Thus, the package of the present invention may include the blocking way which is arranged directly around the cavity, for example, in order to reduce permeation of the package so that an even longer service life can be achieved for the components or medication or accommodation items arranged inside the cavity.

The package optionally includes an intermediate substrate disposed between the base substrate and the cover substrate. In this case, the package has three layers which are arranged one above the other and are or will be joined to one another. The functional area of the package may include at least one cavity and/or at least one functional layer. In other words, a cavity may be provided in the package, in which accommodation items can be arranged so that they will be accommodated and protected by the package. Alternatively or cumulatively, the functional area may include at least one functional layer, for example an electrically active layer or a photoresist layer or the like, for example also a layer that generates electricity when irradiated by appropriate radiation, i.e. a photovoltaic layer.

The blocking way of the package optionally includes a barrier layer. The barrier layer can enclose the functional area, at least partially. For example, if the first substrate is made of a different material than the second substrate, it may be sufficient to protect or block the cavity or the functional area against only one of the two substrates. The barrier layer may include a coating layer, in other words the barrier layer can be applied to at least one of the substrates in the form of a coating, for example by vapor deposition, so that reduced permeability is imparted to this substrate by the barrier layer.

The barrier layer is thus for example disposed on at least one of the base substrate, the cover substrate, and the intermediate substrate. Furthermore, the barrier layer is optionally disposed on an inner side that faces the functional area.

The barrier layer can directly enclose the functional area, i.e. the barrier layer forms part of the peripheral inner surfaces of the functional area or of the cavity. The barrier layer can enclose the functional area against at least one of the substrates, for example, or can completely enclose the functional area on all sides thereof.

The base substrate of the package is optionally made of a material having low permeability. The cover substrate may include a material that has a higher permeability than the base substrate. This may be representative for a typical case of the structure of a package in which a cavity is introduced or integrated in the base substrate and the cavity is closed by placing thereon the cover substrate. The cover substrate that is put or placed thereon can be made of a different material which for example has different optical properties than the base substrate. For example, it is typically intended to produce the laser bonding line by irradiating a laser from above the substrate stack, i.e. from above the wafers arranged one above the other, which will later form the package, in order to introduce the laser bonding lines into the package. The laser must therefore be able to penetrate the cover substrate, but it is not necessary for the laser to be able to pass through the base substrate.

Therefore, a different material can be used for the cover substrate than for the base substrate, which may have properties that the base substrate does not have, and vice versa. In such an arrangement, only the cover substrate might need to be enhanced by the blocking way, with regard to permeation.

Materials that can be used for the substrate(s) include, for example, materials which optionally are biocompatible, or oxidic materials with good chemical resistance. Thus, the substrates, i.e. the cover substrate, the intermediate substrate, and/or the base substrate, may include silicon-based oxides and/or nitrides, optionally $SiO_2$ and/or $Si_3N_4$ and/or also aluminum-based oxides and/or nitrides, optionally $Al_2O_3$ and/or AlN. Thus, in addition to glass, options also include polycrystalline wafers made of $Al_2O_3$, crystallized oxides, or polysilicon. Such materials already exhibit a high blocking functionality. For example, the cover substrate may include at least one of the aforementioned materials, and the base substrate includes a different substrate material or essentially consists of a different substrate material. In this case it makes sense to additionally enhance the base substrate in terms of permeability, by the blocking way.

For this purpose, the blocking way can also be made from a material or a material mix, for example, which is optionally biocompatible, or from oxidic materials with good chemical resistance. For example, the one or more blocking way can include silicon-based oxides and/or nitrides and/or oxynitrides, optionally $SiO_2$ and/or $Si_3N_4$, and/or also aluminum-based oxides and/or nitrides or oxynitrides, optionally $Al_2O_3$ and/or AlN. Furthermore, a barrier layer may also contain oxides, nitrides or oxynitrides based on silicon and aluminum, i.e. $SiAl_xN_y$, $SiAl_xO_y$, or $SiAl_xO_yN_z$. A thin layer that is hermetically bonded or joined to the adjoining substrate can also function as a blocking way. The blocking way can include a metallic material and/or $Si_3N_4$ or $SiO_xN_y$ (silicon oxynitride), for example a layer made therefrom, which may be deposited by plasma enhanced chemical vapor deposition (PECVD), for example, or by sputter-deposition techniques, or by atomic layer deposition (ALD). The blocking way may have a thickness of 1 µm or less, for example, optionally of 500 nm or less, optionally 100 nm or less, optionally of 50 nm or less. The barrier layer or blocking way may even be made with a thickness of 30 nm or thinner in order to achieve the inventive effect.

The blocking way is able to reduce the permeability between the functional area and the environment by at least 30%. In other words, the effect of the blocking way on the substrate material of the substrate on which it is arranged or applied as a barrier layer is to reduce the permeability of this substrate by at least 30%, for example, i.e. to enhance it.

The barrier layer can be adapted so as to reduce the permeability in both directions of penetration through the package. This means that the barrier layer reduces the permeability for a gas, substance, or gaseous mixture enclosed in the cavity in terms of escaping into the environment, as well as the permeability for a gas, substance, or gaseous mixture in the environment in terms of penetrating into the cavity.

The blocking way may furthermore include a second barrier layer. The functional area may be provided between the first barrier layer and the second barrier layer in this case. For example, the first barrier layer can be attached or applied on the cover substrate, the second barrier layer can then be arranged or applied on the base substrate, so that the functional area is surrounded on all of its sides by the first and second barrier layers. The barrier layers are optionally disposed on the sides facing the functional area.

The second barrier layer may also be arranged or applied on top of the first barrier layer, so that the two barrier layers complement their effect in the same direction. Depending on the choice of the material for the barrier layer, this allows to achieve differentiated protection with regard to selected materials. For example, one layer of the blocking way may include $SiO_2$, and the second layer may include $Si_3N_4$, so that complementary protection is achieved by applying both barrier layers on the same side of the cavity.

The base substrate, the one or more intermediate substrates, and/or the cover substrate may include a vitreous material. This can be glass, for example, or glass ceramics, silicon, aluminum oxide, sapphire, or a combination of the aforementioned materials. For example, glass and vitreous materials have proven to be particularly advantageous because they are very well biocompatible, i.e. chemically compatible with the human body, no interactions are known with the human organism, and at the same time glass provides excellent insulating properties. Furthermore, glass can be made such that it is transparent to radiation so that, for example, wireless data exchange can be ensured through radiation or wave information, or else contactless charging of electronics or batteries that are optionally disposed inside the package. If a substrate—for example the cover substrate—is a substrate that is transparent in the optical wavelength range, for example, an optically transparent substrate, power supply to the package can be implemented optically, for example, using a photovoltaic cell or a different type of optical receiver disposed inside the package for providing electrical power. The package can then be described as a self-sufficient package. In order to produce the hermetic seal for example around the functional area, one of the laser bonding lines can for example surround the functional area circumferentially, at a distance DF therefrom. In one example, the distance DF around the functional area is consistent, so that the laser bonding line extends around the functional area at approximately the same distance therefrom on all sides. However, depending on the application case, the distance DF may also vary. This might be more favorable from a production technology point of view when a plurality of packages are joined at the same time in one and the same processing step and straight bonding lines or laser bonding lines are produced along the respective contact areas of the individual packages, for example. This may also be the case if the functional area or the package is round or has an arbitrary shape and the laser bonding line that seals the functional area for example hermetically is drawn in the form of straight lines, for example. In one example, the functional area may be in the form of a cavity, and the cavity may in turn have optical properties, for example it may have the shape of a lens, such as a collecting lens, and the laser bonding line may be drawn around the cavity in a pattern differing therefrom.

The functional area of the package is, for example, adapted to accommodate at least one accommodation item such as an electronic circuit, a sensor, or an MEMS, so that at least one accommodation item is disposed inside the package. The accommodation item may include electronics such as a power semiconductor chip, for example a GaN LED, a SiC power transistor, a GaAs power transistor, or a GaN power transistor. The accommodation item can also be a medication or a fluid provided therein, which is not intended to react with the environment, or at least at a later or predefined point in time.

The accommodation item is optionally disposed in a cavity which is surrounded by the package on all sides thereof, i.e. completely. The functional area or the cavity may have been introduced into the base substrate, for example by hollowing out the base substrate to produce a recess therein, for example in an abrasive manner, so that the functional area and/or the at least one accommodation item is surrounded by the material of the base substrate at the bottom and on the lateral side. The functional area or the cavity may also be provided above the base substrate, for example on the base substrate.

The package may also include a plurality of cavities, for example for accommodating accommodation items in different cavities. For example, a battery or storage cell that might be installed can thus be accommodated in the package separately from other components. Also, for example, a medication can be disposed in a first cavity and control or delivery electronics such as timer electronics can be arranged in a second cavity to control the release of the medication into the environment in the intended manner, for example at a specific time or upon occurrence of a specific event.

The package may furthermore have through-glass passages, for example in an intermediate substrate that separates at least two cavities. Such through-glass passages allow to electrically connect the accommodation items disposed in different cavities. The through-glass passages may for example be in the form of through glass vias (TGV), and the vias are filled with electrically conductive material. The package may also include an electrical connection layer which may, for example, be disposed on an intermediate substrate. In this case it is particularly easy to arrange the components or accommodation items in the respective cavity and to connect them electrically. For example, the electrical connection layer is disposed on the bottom of the one or more cavities and can be electrically connected to through-glass passages.

An example of a functional area that is not in the form of a cavity is the application of an electrical connection layer on a substrate, which already defines a functional area without a cavity. Such an electrical connection layer may, for example, electrically connect two other functional areas to one another, for example two cavities.

A substrate may also include a plurality of layers and may thus be a multi-layer laminate or composite. Such a multi-layer composite defining one of the layers of the package can then be bonded to the one or more further substrates by the laser welding process. This can therefore mean that the multi-layer composite is prepared in advance, for example by applying a coating onto a substrate and thus producing a two-layer composite, and this two-layer or multi-layer composite as a whole will be bonded to the one or more layers in the manufacturing process of the package for making the package.

Employing a multi-layer composite in the package allows to add additional material properties to the package, which could not be achieved by using single layer substrates. For example, the multilayer composite may already have an internal stress or prestress or a direction of prestress, so that the amount of internal stress can be enhanced during the laser welding of the multilayer composite to the at least one further layer of the package. For example, if a preliminarily toughened multi-layer composite is used, this can improve the durability of the package. As a result, the package as a whole may take on the properties of a toughened package.

In addition or as an alternative, the multi-layer composite may include one or more coating layers, for example a coating that might give rise to complications if this layer had to be bonded using the laser welding process. In other words, a substrate that is provided in the form of a multi-layer composite is provided as a "pack" or "stack" including layers that are already bonded together.

Depending on the application requirements, other techniques than the laser welding process can be used as well for producing the glass-to-glass bond. These include, for example: anodic bonding, glass frit bonding, or melting using a $CO_2$ laser. Below, the laser welding will be detailed as a representative process for application examples. The laser welding process can be controlled locally such that only a small or negligible amount of heat penetrates into the functional area or into the one or more cavities as a result of the welding process. Thus, the laser welding process is executed virtually at room temperature, i.e. the package is virtually joined at room temperature.

The laser bonding line extends into the material of the substrate arranged above the laser bonding line, for example over a height HL. Within the laser bonding line, a local melting process occurs in the material so that, when the laser bonding line extends partly into a first substrate and partly into a second substrate, the two substrates are bonded to one another by being fused together. In other words, the base substrate, the intermediate substrate(s), and the cover substrate are joined together by being fused to one another by the laser bonding line(s).

In other words, the laser bonding line is provided or adapted so as to be capable of bridging gaps in the hermetic sealing of the package, for example by fusing two components to one another by the laser bonding line. In a case where the package only includes a base substrate and a cover substrate for completely enclosing the functional area, the contact area between base substrate and cover substrate, i.e. the site or area or interface where the cover substrate and the base substrate adjoin each other, is bridged or bonded by the laser bonding line. As a result, the package is formed as an integral piece, with the interface between the components hermetically sealed by the laser bonding line.

The package is optionally transparent for some range of wavelengths at least partially and/or in portions thereof. In a simple example, the cover substrate of the package is optically transmissive, i.e. transparent in the visible wavelength range. However, transparency in the UV or IR range, for example, may be advantageous as well. In other words, the cover substrate, for example, optionally includes a non-conductive e.g. oxidic or nitride material, for example a vitreous material, or else a metallic glass. Consequently, the cover substrate is optionally transparent or transmissive for at least one range of wavelengths, for example optically transparent. Depending on the application case, it may also be advantageous if for instance the cover substrate is made to be opaque, i.e. optically non-transparent, like frosted glass or polycrystalline oxide ceramics. Reduced transparency or partial transmittance may also be sufficient for the functionality.

In an optional embodiment, the cover substrate is a glass sheet, for example made of toughened glass, special glass, or high temperature resistant glass from the Applicant's product portfolio.

The package can be designed so that the at least one functional area of the package can be adapted to accommodate at least one accommodation item. Accommodation items to be accommodated in the at least one functional area may have a size of 20 mm×20 mm or less, for example they can be circular or oval, with a diameter of 15 mm or less, for example. The accommodation items may also have a size of 10 mm×10 mm or less, optionally a size of 5 mm×5 mm or less, optionally 2 mm×2 mm or less, or even 1 mm×1 mm or less. The size of the package will then depend on the size and number of accommodation items inside the functional areas or cavities of the package. For example, if a single accommodation item with a size of about 5 mm×5 mm is disposed in each one of a plurality of cavities of the package which includes two cavities arranged next to each other, for example, and two cavities on top of each other, the package can, for example, have a size of 13 mm×13 mm or more, in order to ensure accommodation of the items inside the cavities.

The substrates may have a thickness of about 1 mm, about 0.7 mm, about 0.5 mm, about 0.1 mm, or can be thinner. In other words, the thickness of one of the substrates of the package is in a range of less than or equal to 2 mm, for example, optionally less than or equal to 1 mm, more optionally less than or equal to 0.5 mm, or less than or equal to 0.1 mm.

A size specification based on practical considerations and determined by the optional fabrication method, which should however not be understood as a size limitation per se, is given by the size of the wafers to be cut. However, the use of wafers for the fabrication is considered to be only one example. For example, it is entirely possible to use glass sheets which can also have larger or smaller dimensions than typical wafer dimensions for producing the transparent package.

In any case, the blocking way of the package includes a barrier layer, for example a coating layer, which at least partially encloses the functional area. In other words, the blocking way can be in the form of a barrier layer that is disposed between the cavity and the package surrounding the cavity.

The barrier layer is optionally disposed on at least one of the base substrate, the cover substrate, and the intermediate substrate, specifically on the inner side facing the functional area, for example. The barrier layer can then also be protected by the material of the package. This is advantageous when the barrier layer per se does not have the same mechanical or chemical resistance as the material of the base or cover substrates, for example.

The barrier layer can therefore enclose the functional area directly, for example against at least one of the substrates, or completely.

The base substrate can be made of a material with comparatively low permeability. The cover substrate may include a material that has a higher permeability than the base substrate. In this case it is advantageous to arrange the blocking way between the functional area and the cover substrate, while it would not be necessary in this example to employ the blocking way between the cavity or functional area and the base substrate.

The blocking way may include silicon-based oxides and/or nitrides and/or oxynitrides, optionally $SiO_2$ and/or $Si_3N_4$ and/or aluminum-based oxides and/or nitrides and/or oxynitrides as well, optionally $Al_2O_3$ and/or AlN. Furthermore, a barrier layer may also include oxides, nitrides, or oxynitrides based on silicon and aluminum, i.e. $SiAl_xN_y$, $SiAl_xO_y$, or $SiAl_xO_yN_z$.

The blocking way may, for example, have a thickness of 1 μm or less, more optionally 500 nm or less, yet more optionally 100 nm or less, most optionally 50 nm or less. The barrier layer or blocking way can also be made 30 nm or thinner in order to achieve the effect according to the present invention.

The blocking way can be produced or adapted such that the permeability between the functional area and the environment surrounding the package is reduced by at least 30%. The blocking way is optionally adapted such that it reduces permeation by at least 50%, optionally by at least 75%. For example, the blocking way is able to reduce the permeability with regard to water or water vapor. For example, the blocking way is able to reduce the permeability in both directions of penetration through the blocking way. This means that water vapor or gases or fluids or, more generally, any substances that tend to penetrate from the external environment into the functional area will be blocked by the blocking way, but also fluids or substances that tend to escape from the functional area into the external environment. The "tendency of the fluid to penetrate" is caused by an osmotic pressure, for example, or by a physical pressure difference or a combination of the two causes, which defines the permeability.

If the blocking way includes a second barrier layer, the functional area can be arranged between the first barrier layer and the second barrier layer. In this example, the first barrier layer may be disposed on the cover substrate or at the cover substrate, and the second barrier layer can be disposed on the base substrate.

On the other hand, the second barrier layer may also be arranged on top of the first barrier layer, i.e. on the same side of the cavity as the first barrier layer. The first and second barrier layers can thus be complementary to one another in terms of the barrier effect they achieve.

The invention furthermore focuses on a method for providing a hermetically sealed package including a functional area, for example a cavity, enclosed by the package. The method includes the steps of:

providing at least a base substrate and a cover substrate, with the cover substrate being transparent for at least one range of wavelengths at least partially or in portions thereof and therefore being a transparent cover substrate;

arranging the cover substrate on the base substrate and above the functional area, thereby creating at least one contact area between the base substrate and the cover substrate, so that each package has at least one contact area;

hermetically sealing the cavities by producing at least one laser bonding line along the at least one contact area of each package, with a blocking way disposed between the functional area and the cover substrate and/or between the functional area and the base substrate.

Optionally, the cover substrate is joined to the base substrate by the laser bonding line. In other words, the cover substrate is placed on or in the base substrate without any intermediate layer, and is joined to the base substrate immediately and directly by one or more shared laser bonding lines. In this case, the cover substrate and the base substrate conjointly form the complete package. In other words, no additional or further part is required to form or to seal the package, rather the base substrate, the at least one laser bonding line and the cover substrate jointly seal the functional area or the cavity completely and in a hermetically sealing manner. On the other hand, it may be advantageous to use one or more intermediate substrates, for example to separate a plurality of cavities from one another.

The at least two substrates or the base substrate and the cover substrate are arranged or attached to one another such that they come to lie flat against one another without any other sheets, layers, or inclusions present between the at least two substrates or between the base substrate, the cover substrate and optionally the intermediate substrate. For technical reasons, there might be unavoidable minor gas inclusions between the layers in the contact areas, which may be caused by some possible unevenness. The amount of gas trapped in the 2-dimensional contact area can be further reduced by increasing the pressure, for example, such as for example by pressing, or by a surface treatment of the substrate layers, for example of the contact surfaces, such as a grinding process. Prior evacuation is beneficial. Filling with a type of gas or else with a liquid may also be advantageous, depending on the process parameters and the materials to be employed.

Particularly optionally, a gap that might arise between the substrates has a width of less than or equal to 5 μm, optionally less than or equal to 1 μm. It is then possible to laser weld in such a manner that the welding zone has a thickness between 10 and 50 μm and a hermetic seal is ensured.

A contact area does not need to be optically transparent. It is also advantageous if the transparent substrate is opaque in the visible wavelength range. Only the substrate through which the laser passes to reach the contact area has at least one spectral "window" such that at least the wavelength of the employed laser can be transmitted through the substrate at least partially or at least in sections thereof. The contact area is adapted such that the laser is able to deposit energy there. For example, the surfaces of the two adjoining substrates may be joined by optical contact bonding and may furthermore optionally exhibit a roughness in the nanometer range. The laser radiation will at least partially be absorbed at this interface, so that energy can be introduced there. In the sense of the present application, contact area is generally understood to mean an interface at which the incident laser beam can deposit energy so that a bonding process can be performed along a line within the contact area.

Prior to the step of arranging the cover substrate on the base substrate, the method can furthermore include the further step of arranging the blocking way on the cover substrate and/or on the functional area.

The step of providing the cover substrate may include providing the cover substrate already equipped with the blocking way, and/or the step of providing the base substrate may include providing the base substrate already equipped with the blocking way.

Also within the scope of the present invention is the package produced or formed by the aforementioned method.

In order to form the laser bonding line, a laser beam is directed for example around the functional area so that the functional area is hermetically sealed circumferentially along the at least one contact area. Optionally, the laser beam can be directed circumferentially around multiple times, and/or optionally a plurality of laser bonding lines can be formed.

Furthermore within the scope of the present invention is the use of a package as produced according to the method described above, with a hermetically sealed functional area or cavity enclosed therein, as a medical implant or bio-implant, or as a sensor.

BRIEF DESCRIPTION OF THE DRAWINGS

The above-mentioned and other features and advantages of this invention, and the manner of attaining them, will become more apparent and the invention will be better understood by reference to the following description of embodiments of the invention taken in conjunction with the accompanying drawings, wherein:

FIG. 1 shows a plan view of a package;

FIG. 2 shows a sectional side view of a package;

FIG. 3 is a detailed view of a bonding zone;

FIG. 4 is a sectional side view through the functional area of a package;

FIG. 4a is a sectional side view as in FIG. 4, but with two accommodation items;

FIG. 6 is a sectional side view through yet another embodiment of a package;

FIG. 6a is a sectional plan view as indicated in FIG. 6;

Corresponding reference characters indicate corresponding parts throughout the several views. The exemplifications set out herein illustrate embodiments of the invention, and such exemplifications are not to be construed as limiting the scope of the invention in any manner.

DETAILED DESCRIPTION OF THE INVENTION

Figure 5:
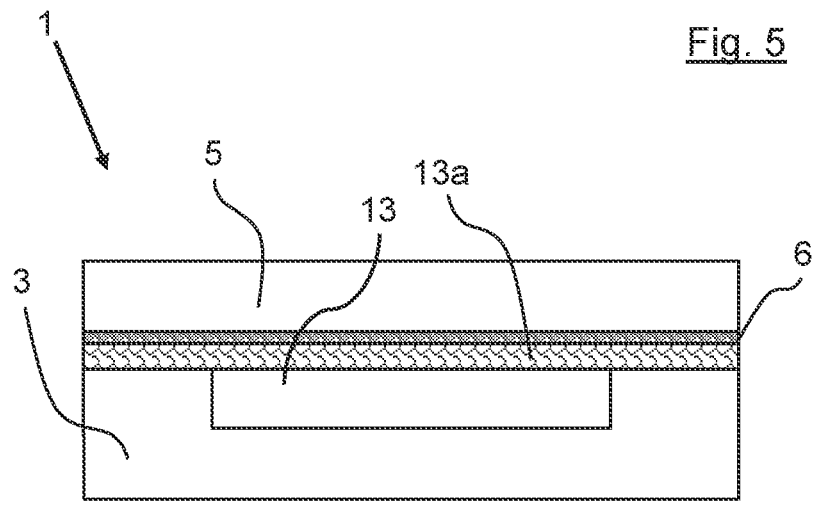
FIG. 5 is a sectional side view through a further embodiment of a package.

FIG. 1 shows a plan view of a package 1 according to the present invention, with the circumferential laser welding zone 8 surrounding the functional area 13. Functional area 13 may be implemented in different ways. Examples of different configurations of the functional area 13 can also be found in FIGS. 3 through 7, which show sectional views and thus permit to illustrate the vertical structure of functional area 13. The various implementations of functional area 13 can all be schematically illustrated as in FIG. 1, as they will be represented similarly in a schematic plan view. Functional area 13 is rectangular in the example of FIG. 1. Depending on the technique to produce the functional area 13 of the package, the functional area 13 can assume different shapes. For example, cavities produced by abrasive processes can be formed so as to be lens-shaped.

Functional area 13 may fulfill various tasks, for example it may be implemented as an optical receiver or it may include a technical, optical, electro-mechanical, and/or electronic component 2 which is disposed in the functional area 13. It is also possible to implement a plurality of such tasks in the functional area 13. On the upper side, the package 1 is covered by the upper substrate 5. The or at least one laser welding zone 8 extends into this upper substrate 5.

Referring to FIG. 2 which shows a first sectional view of a first embodiment of a package 1, which includes a base substrate 3 and a cover substrate 5. In other words, package 1 is made up or composed of two layers, namely base layer 3 and cover layer 5. FIG. 2 also shows the structure of laser welding line 8 in the form of a string of multiple laser pulse impact areas 16 which are placed so close to one another that the material of the base substrate 3 and of the cover substrate 5 seamlessly fuses to one another thereby hermetically sealing the functional area 13 or the cavity 12 (located behind the laser welding line 8 in this view).

FIG. 3 shows a detail of the joining area, illustrating the interface zone, i.e. the contact area 25 and the laser welding zone 8. Laser welding zone 8 is provided in the contact area 25 to bond the two substrates 3, 5 to one another.

FIG. 4 shows a sectional view of an embodiment of a package 1 along line C-D as indicated in FIG. 1. Thus, FIG. 4 shows a sectional view through functional area 13, 13a which extends inside the package 1, for example in the form of a continuous hollow space or cavity. In other words, the cavity extends from base substrate 3 into the cover substrate 5 and, for example, is in the form of a recess made in the base substrate 3 and/or in the cover substrate 5. Here, functional area 13 is formed as a recess in cover substrate 5, functional area 13a has been formed as a recess in base substrate 3, for example by an abrasive process such as a sandblasting process. In other words, the base substrate 3 has a recess 13a.

For example, the functional area 13a may include an active layer, e.g. an electrically conductive layer 34. The active layer of functional area 13a may also include a photoreceiver, for example in the form of a photovoltaic cell, so as to be adapted to generate electrical power. In this case, the package 1 can be a self-sufficient package 1.

The laser welding zone 8 provided circumferentially around the functional area 13a seals the functional area 13a all around along the lateral sides thereof. It is conceivable to leave gaps in the laser welding zone 8 so that the functional area 13a will not be sealed all around, for example in order to keep open a communication channel or space for an electrical connection, which may however also be used to establish fluid communication with the environment, for example. In other words, it might be contemplated to not seal predefined locations or points using the focused laser beam 9, but to rather achieve a hermetic seal by other ways there. Optionally, however, like shown in FIG. 1, the functional area 13, 13a is sealed along all of its sides and without any gaps, in order to ensure hermetic sealing of the functional area 13, 13a.

FIG. 4 furthermore shows a first embodiment of a blocking way 6, and this blocking way 6 is disposed on the underside of the cover substrate 5 and thus directly adjoins the functional area 13a. The blocking way of the embodiment of FIG. 4 therefore improves the permeability regarding penetration of the cover substrate. In this example, the material of the base substrate has a lower permeability than the cover substrate, so that a circumferential blocking way 6 or a blocking way 6 enclosing the functional area 13a on all sides is not necessary. It is sufficient to reduce or enhance the permeation as seen from the functional area 13a towards the cover substrate 5.

FIG. 4a shows the embodiment of FIG. 4, with two accommodation items 2 arranged in cavity 12. The accommodation items 2 may include an electronic component, for example. The two embodiments may also be combined with one another. For example, if the active layer 34 is an electrically conductive layer 34, the components 2 can be arranged on the conductive layer 34 and connected to one another.

Referring to FIG. 5 which shows a further sectional view through a package 1 within the range of functional area 13, 13a. The package 1 includes two substrate layers, namely base substrate 3 and cover substrate 5. A functional layer 13a is arranged over the entire surface area between the base substrate 3 and the cover substrate 5, and the blocking way 6 is disposed above functional layer 13a.

In fact, as the functional area 13a is implemented as a functional layer 13a here, it is therefore not protected on two sides, i.e. its circumferential narrow sides. However, this might be tolerable, depending on the application and the material of the functional layer 13a, for example if the functional layer is an optical frequency filter or an anti-reflective coating.

Figure 5A:
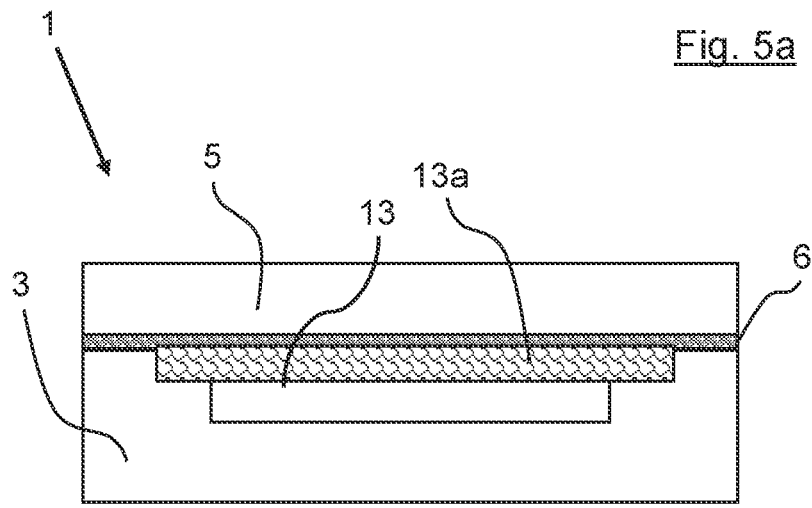
FIG. 5a is a sectional side view through a further embodiment of a package.

By contrast, FIG. 5a shows an embodiment similar to FIG. 5, here, however, with the functional layer 13a surrounded on all of its sides by the package. In this case, i.e. if the base substrate 3 has the lower permeability compared to the cover substrate 5, it is still sufficient for the blocking way 6 to be arranged above the functional layer 13a towards the cover substrate 5. The functional area 13 is in the form of a cavity 12, and the cavity 12 may contain one or a plurality of components 2 or of any accommodation items 2 as well as a medication dose 2 disposed therein.

FIG. 6 shows a further embodiment of the encapsulation solution according to the present invention, with the package including three substrate layers, namely base substrate 3, an intermediate substrate 4, and cover substrate 5. The intermediate substrate 4 may either be made up of spacer pieces, for example, or it may be a continuous substrate, i.e. a sheet with inner cutouts which is also referred to as a spacer 4.

The package of the embodiment of FIG. 6 includes a first blocking way 6 which is arranged at the upper side of cavity 12 and thus on the underside of cover substrate 5. The package 1 furthermore includes a second blocking way 6a on the bottom of cavity 12, which is disposed on the upper surface of base substrate 3. Such an arrangement of two blocking ways 6, 6a on either side of the functional area 12, 13, 13a to be enclosed can be chosen, for example, when both the base substrate 3 and the cover substrate 5 exhibit rather high permeability. In this case, both substrates can be blocked by the blocking ways 6, 6a, that is, the permeability through the respective substrate is reduced. In the example of FIG. 6, the blocking ways 6, 6a do not enclose the intermediate substrate 4, so this represents a simplified embodiment which is particularly simple and easy to implement in terms of manufacture. Depending on the given implementation of the intermediate substrate, it may be possible to omit the blocking way on the intermediate substrate, so as to dispense with any complicated application or deposition processes on the intermediate substrate 4. However, even if the intermediate substrate has a comparatively high permeability, it may be sufficient to block only the base substrate 3 and the cover substrate 5 with the blocking ways 6, 6a, since the surface area of the intermediate substrate 4 which is in contact with the functional area 12, 13, 13a is fairly small. Diffusion in particular depends on the size of the item, i.e. the size through which the gas or fluid has to flow. However, if the surface area is only small, only a small amount of fluid will pass through the intermediate substrate 4, so that, depending on the application, the blocking ways 6, 6a can be omitted on the latter. On the other hand, complete enclosure of the functional area is of course also conceivable, see FIG. 7.

FIG. 6a shows the embodiment of FIG. 6, rotated about 90°, in a sectional plan view. Thus, this sectional view cuts through the intermediate substrate 4 and the functional area 13 in the form of cavity 12.

Figure 7:
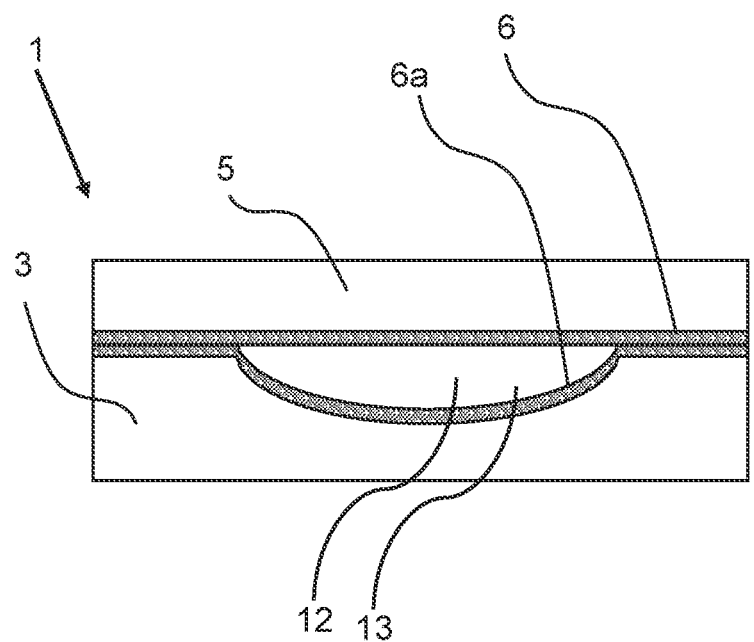
FIG. 7 is a sectional side view through yet another embodiment of a package.
Figure 8A:
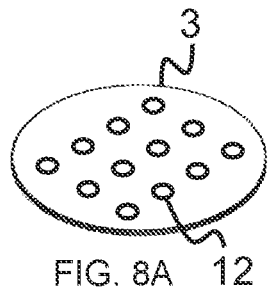
FIGS. 8A, 8B, 8C, and 8D show exemplary steps for producing a package.
Figure 8B:
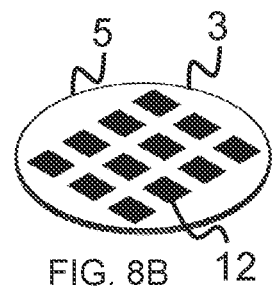
Figure 8C:
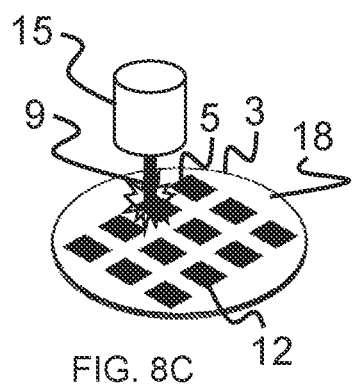
Figure 8D:
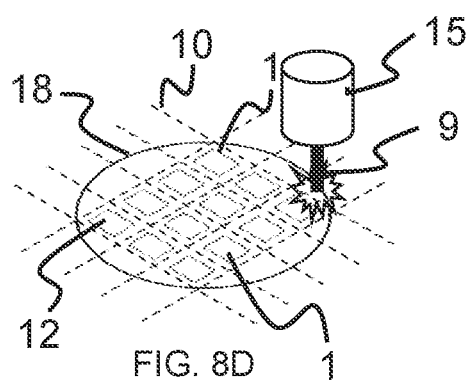

FIG. 7 shows yet another embodiment of the present invention, again with the functional area 13 in the form of a cavity 12 which has a non-planar bottom here. For example, the cavity 12 has the shape of a lens, in the case as shown in FIG. 7 a plano-convex lens. In other words, the cavity 12 is adapted such that a convex recess 12 is hollowed out in the base substrate 3, for example by an abrasive process, so that the base substrate has a concave upper side. In this way, an optical property of the package can be created and may have impacts for the accommodation item 2 arranged inside the cavity 12 (see, for example, FIG. 4a). The package of FIG. 7 includes a blocking way 6 in the form of a barrier layer. The barrier layer can be considered or implemented as a consistent peripheral barrier layer surrounding the cavity 12, but it may also be implemented by two separate process steps, for example on the underside of cover substrate 5 in the form of a first barrier layer 6, and as a second barrier layer 6a that is applied to the upper surface of base substrate 3. So, it may include coating layers that are applied to the respective substrate. On the other hand, the blocking way 6 may also be arranged on the respective substrate, for example by being glued thereto or attached in some other way. In the example of FIG. 7, the functional area 13 is completely enclosed by the blocking way, i.e. on all sides, so that permeation is reduced in all spatial directions.

Referring to FIGS. 8A to 8D, FIGS. 8A to 8D show an embodiment of the method for producing a multitude of packages 1. What shall be explained here is the fabrication of packages 1 like those illustrated in the preceding figures, for example. It will be obvious for a person skilled in the art that it is likewise possible to produce just one single package 1 with the method, depending on process requirements.

In a step A (FIG. 8A), a shared base substrate 3 is provided, as a carrier substrate, which has a plurality of recesses 12 corresponding to the later cavities 12, and which were introduced into the base substrate 3 by an abrasive process, for example. The cavities 12 may, for example, be introduced into the base substrate 3 by a sandblasting process, that is to say hollowed out of the base substrate 3, more generally using an abrasive process. Chemical etching is also possible for introducing the cavity 12 into the base layer 3. Accommodation items 2 such as a sensor, actuator, processor, or medication can be placed in the recesses 12, for example.

A blocking way 6, 6a can be provided on the base substrate 3 as well as on the cover substrate and/or optionally on the intermediate substrate, for example in the form of a coating layer 6. For example, PVD or CVD or other thin-film coating techniques can be employed to provide at least one side of a substrate 3, 4, 5 with a thin barrier layer 6, 6a, optionally the side facing the cavity. This layer may include $SiO_2$ in order to optionally reduce the penetration of water or water vapor. It may also include $Si_3N_4$ or $Al_2O_3$ or Al. On the other hand, the blocking way 6, 6a may also be placed on a substrate 3, 4, 5, optionally on the side facing the functional area 13, 13a. For example, a thin layer or a thin element can be placed there to be joined with the other substrates 3, 5 and optionally 4 in step C.

In a step B (FIG. 8B), a shared cover substrate 5 is attached on the base substrate 3, i.e. a cavity 12 is created for each recess, by covering the base substrate 3 with the cover substrate 5 and then hermetically joining them by step C. It is possible to accommodate a plurality of accommodation items 2 in a respective shared cavity 12.

In step C (FIG. 8C), the substrates are joined directly to one another by respective laser bonding lines 8. In this way, two closed-loop circumferential laser welding zones 8 can be established by directing the laser 9 twice around each cavity 12 along the contact surfaces 25, i.e. along the periphery of the cavities 12, but not on an exactly identical path. Rather, the laser 9 can be guided along a laterally offset path during each revolution around the cavity 12, so that two adjacent laser welding zones 8 are created. The microbonding zones 8 may have dimensions of, e.g., 5 μm×10 μm or smaller, or 10 μm×50 μm or smaller.

Thus, the finished substrate stack is bonded together using a laser, so that the respective accommodation cavities 12 are hermetically sealed, which means the sealing of the cavities 12 all around along contact areas 25 and the introduction of the at least one laser bonding line 8 per package 1. For this purpose, a laser unit 15 is moved over the surface of the cover substrate 5 from above the cover substrate 5, and a focused laser beam 9 is selectively directed to the zones to be joined, that is for example to the contact areas 25. Once step C of the manufacturing process has been completed, all of the cavities 12 will have been hermetically sealed. Following step C, the individual packages 1 can be separated from one another by a cutting process, so as to obtain individual separate packages 1.

In step D (FIG. 8D), the components are separated from one another along separation or cutting lines 10. Optionally, the same laser as for the laser welding in step C may be used for this purpose. However, a conventional cutting technique may also be employed, if this is advantageous.

For example, the pressure, which due to the permeability builds up in the cavity 12 towards a substrate 3, 4, 5 of the package 1 or towards the environmental conditions around the package 1, can be composed as $$Q = \Delta p \circ \left(1 - e^{-\frac{KA2D}{2DVd+KAd^2}t}\right)$$

wherein D and K depend on the temperature, and wherein
Δp is the partial pressure difference between the interior of the cavity and the environment,
K is the permeability,
D is the diffusion coefficient,
A is the surface area of the package 1 or of the corresponding substrate 3, 4, 5 to be penetrated, in $cm^2$,
V is the volume of cavity 12, in $cm^3$,
d is the wall thickness of substrate 3, 4, 5 or package 1, in cm,
t is the time, in seconds.

It will be apparent to a person skilled in the art that the embodiments described above are meant to be exemplary and that the invention is not limited thereto but may be varied in many ways without departing from the scope of the claims. Furthermore, it will be apparent that irrespective of whether disclosed in the description, the claims, the figures, or otherwise, the features individually define essential components of the invention, even if they are described together with other features. Throughout the figures, the same reference numerals designate the same features, so that a description of features that are possibly only mentioned in one or at least not in conjunction with all figures can also be transferred to such figures with regard to which the feature has not explicitly been described in the specification.

LIST OF REFERENCE NUMERALS

1 Package, for example hermetically sealed
2 Accommodation item, functional component
3 Lower substrate, layer or wafer, base substrate, or lower cover
4 Intermediate layer
5 Upper substrate, layer or wafer, cover substrate, or upper cover
6, 6a Blocking way
8 Laser welding zone, laser bonding line
9 Focused laser beam
10 Separation or cutting line
12 Accommodation cavity
13 Functional area
13a Second functional area
14 Rim
15 Laser unit for welding and/or cutting
16 Laser pulse impact area
18 Substrate stack
21 Rim of cavity
22 Bottom of cavity
23 Upper side of cavity
25 Contact area While this invention has been described with respect to at least one embodiment, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A package for encapsulating at least one functional area against an environment, the package comprising:
a base substrate;
a cover substrate, the base substrate together with the cover substrate defining at least a part of the package or defining the package, the at least one functional area being provided inside the package;
at least one blocking way configured for reducing a permeation between the environment and the at least one functional area; and
at least one laser bonding line for hermetically joining two adjacent substrates of the package, wherein the at least one laser bonding line comprises mixed melted material from said two adjacent substrates, wherein the at least one laser bonding line has a height (HL) perpendicular to a bonding plane of the at least one laser bonding line, the at least one laser bonding line extending into the two adjacent substrates joined by said at least one laser bonding line.

2. The package of claim 1, wherein at least one of: (a) the package further comprising at least one intermediate substrate disposed between the base substrate and the cover substrate; and (b) the at least one functional area comprising at least one of at least one cavity and at least one functional layer.

3. The package of claim 1, wherein the at least one blocking way comprises or is formed as a barrier layer, which at least partially encloses the at least one functional area.

4. The package of claim 3, further comprising at least one intermediate substrate disposed between the base substrate and the cover substrate, wherein at least one of:
the barrier layer is disposed (a) on at least one of the base substrate, the cover substrate, and the at least one intermediate substrate, or (b) on an inner side, of at least one of the base substrate, the cover substrate, and the at least one intermediate substrate, facing the at least one functional area; and
the barrier layer (a) directly encloses the at least one functional area, against at least one of the base substrate, the cover substrate, and the at least one intermediate substrate, or (b) completely encloses the at least one functional area.

5. The package of claim 1, wherein the cover substrate comprises a material which has a higher permeability than the base substrate.

6. The package of claim 1, wherein at least one of:
the at least one blocking way comprises $SiO_2$, $Si_3N_4$, $Al_2O_3$, or AlN;
the at least one blocking way comprises a metallic material;
the at least one blocking way comprises $SiO_xN_y$ or $AlO_xN_y$; and
the at least one blocking way comprises $SiAl_xN_y$, $SiAl_xO_y$, or $SiAl_xO_yN_z$.

7. The package of claim 1, wherein the at least one blocking way has a thickness of 1 μm or less.

8. The package of claim 1, wherein the at least one blocking way is configured to reduce a permeability to substances between the at least one functional area and the environment by at least 30%.

9. The package of claim 1, wherein the at least one blocking way reduces a permeability for water and hydrogen.

10. The package of claim 1, further comprising at least one intermediate substrate disposed between the base substrate and the cover substrate, the package further comprising two directions of penetration, wherein the at least one blocking way reduces a permeability in the two directions of penetration through the at least one blocking way and through the base substrate, the cover substrate, and the at least one intermediate substrate of the package.

11. The package of claim 1, wherein the at least one blocking way comprises a first barrier layer and a second barrier layer; and wherein the at least one functional area is arranged between the first barrier layer and the second barrier layer.

12. The package of claim 1, further comprising at least one intermediate substrate disposed between the base substrate and the cover substrate, wherein at least one of the base substrate, the at least one intermediate substrate, and the cover substrate comprises a vitreous material, a polycrystalline material, a glass, a glass ceramic, silicon, aluminum oxide, sapphire, aluminum nitride, or a combination thereof.

13. The package of claim 1, further comprising at least one laser bonding line, the base substrate and the cover substrate being hermetically joined to one another by the at least one laser bonding line, wherein the at least one laser bonding line circumferentially surrounds the at least one functional area at a distance (DF) therefrom.

14. The package of claim 1, wherein the at least one functional area is configured for accommodating at least one accommodation item so that the at least one accommodation item is disposed inside the package.

15. The package of claim 14, wherein the at least one accommodation item comprises a power semiconductor chip, which is selected from the group consisting of a GaN LED, a SiC power transistor, a GaAs power transistor, and a GaN power transistor.

16. The package of claim 14, wherein the at least one functional area comprises at least one cavity, wherein at least one of:
the at least one accommodation item is disposed in the at least one cavity; and
the at least one cavity comprises a plurality of cavities configured for accommodating at least one accommodation item in each respective one of the plurality of cavities.

17. The package of claim 1, further comprising at least one intermediate substrate disposed between the base substrate and the cover substrate, wherein at least one first laser bonding line joins the cover substrate and the intermediate substrate and at least one second laser bonding line joins the intermediate substrate and the base substrate.

18. The package of claim 1, wherein the package is transparent for a range of wavelengths at least partially and/or in portions thereof.

19. The package of claim 1, wherein the at least one functional area of the package is adapted for accommodating at least one accommodation item having a size of 10 mm×10 mm or less.

20. The package of claim 1, further comprising at least one intermediate substrate disposed between the base substrate and the cover substrate, wherein the base substrate, the cover substrate, and the intermediate substrate of the package are hermetically joined together by anodic bonding, bonding with an organic adhesive, glass frit bonding, or fusing using a $CO_2$ laser.

21. A method for providing the package of claim 1, the method comprising the steps of:
providing the base substrate and the cover substrate, the cover substrate being transparent for at least one range of wavelengths at least partially or in portions thereof and therefore being a transparent cover substrate;
arranging the cover substrate on the base substrate and above the at least one functional area thereby creating at least one contact area between the base substrate and the cover substrate, so that the package has at least one contact area;
hermetically sealing the at least one functional area including at least one cavity by forming at least one laser bonding line along the at least one contact area of the package; and
arranging the at least one blocking way at least one of between the at least one functional area and the cover substrate and between the at least one functional area and the base substrate.

22. The method of claim 21, further comprising, prior to the step of arranging the cover substrate on the base substrate, a step of arranging the blocking way at least one of on the cover substrate, on the at least one functional area, and on the base substrate.

23. The method of claim 21, wherein at least one of:
the step of providing the cover substrate comprises providing the cover substrate already equipped with the blocking way; and
the step of providing the base substrate comprises providing the base substrate already equipped with the blocking way.

24. The method of claim 21, wherein a laser beam is directed around the at least one functional area to form the at least one laser bonding line so that the at least one functional area is hermetically sealed circumferentially along the at least one contact area; wherein at least one of (a) the laser beam is directed circumferentially around a plurality of times, and (b) a plurality of the laser bonding line is formed.

25. A package, comprising:
at least one cavity which is at least one hermetically sealed accommodation cavity, the package being produced by a method, wherein the package encloses at least one functional area including the at least one cavity, the method comprising the steps of:
providing a base substrate and a cover substrate, the cover substrate being transparent for at least one range of wavelengths at least partially or in portions thereof and therefore being a transparent cover substrate;
arranging the cover substrate on the base substrate and above the at least one functional area thereby creating at least one contact area between the base substrate and the cover substrate, so that the package has at least one contact area;
hermetically sealing the at least one functional area including the at least one cavity by forming at least one laser bonding line along the at least one contact area of the package, wherein the at least one laser bonding line comprises mixed melted material from the two adjacent substrates, wherein the at least one laser bonding line has a height (HL) perpendicular to a bonding plane of the at least one laser bonding line, the at least one laser bonding line extending into the two adjacent substrates joined by said at least one laser bonding line; and
arranging a blocking way at least one of between the at least one functional area and the cover substrate and between the at least one functional area and the base substrate.

26. A method of using the package of claim 1, with at least one cavity enclosed therein, the at least one cavity being formed as at least one hermetically sealed accommodation cavity, the method comprising the steps of:
providing that the package encloses the at least one functional area including the at least one cavity;
producing the package by a method of production, comprising the steps of:
providing the base substrate and the cover substrate, the cover substrate being transparent for at least one range of wavelengths at least partially or in portions thereof and therefore being a transparent cover substrate;
arranging the cover substrate on the base substrate and above the at least one functional area thereby creating at least one contact area between the base substrate and the cover substrate, so that the package has at least one contact area;
hermetically sealing the at least one functional area including the at least one cavity by forming at least one laser bonding line along the at least one contact area of the package; and
arranging the at least one blocking way at least one of between the at least one functional area and the cover substrate and between the at least one functional area and the base substrate; and
using the package as a medical implant or as a sensor.

27. The package of claim 5, wherein the at least one blocking way is disposed between the at least one functional area and the cover substrate without being disposed between the at least one functional area and the base substrate.

* * * * *